Aug. 16, 1955 R. L. CAMPBELL 2,715,681

TUNER FOR ULTRA HIGH FREQUENCIES

Filed Sept. 21, 1949 4 Sheets-Sheet 1

INVENTOR.
RICHARD L. CAMPBELL
BY Darby & Darby
Attorneys

TUNER FOR ULTRA HIGH FREQUENCIES

Filed Sept. 21, 1949 4 Sheets-Sheet 2

INVENTOR.
RICHARD L. CAMPBELL
BY Darby & Darby
Attorneys

INVENTOR.
RICHARD L. CAMPBELL
BY Darby & Darby
Attorneys

Aug. 16, 1955 R. L. CAMPBELL 2,715,681

TUNER FOR ULTRA HIGH FREQUENCIES

Filed Sept. 21, 1949 4 Sheets-Sheet 4

INVENTOR.
RICHARD L. CAMPBELL
BY Darby & Darby
ATTORNEYS

United States Patent Office 2,715,681

Patented Aug. 16, 1955

2,715,681

TUNER FOR ULTRA HIGH FREQUENCIES

Richard L. Campbell, Melrose, Mass., assignor to Allen B. Du Mont Laboratories, Inc., Passaic, N. J., a corporation of Delaware Application September 21, 1949, Serial No. 116,945

8 Claims. (Cl. 250—40)

My invention relates to electrical apparatus for the reception of high frequency oscillations, and in particular to a tuner or converter for the reception of ultra high frequency signals.

Apparatus in use at frequencies in the order of 300 to 1,000 megacycles often makes use of tuned elements which are either of the type known as tuned lines, or the type known as lumped constants. Tuned lines possess the advantages of greater electrical stability but usually are quite expensive to manufacture.

An object of my invention is to provide a tuner for these frequencies having new structural features, which features provide improved electrical stability and wide tuning range.

Another object of my invention is to provide a tuner which is capable of being manufactured in large quantities at low cost.

Other objects will be apparent from the accompanying description, claims and drawings in which:

Figures 1, 2, 3, 4, 5, 6, 7:
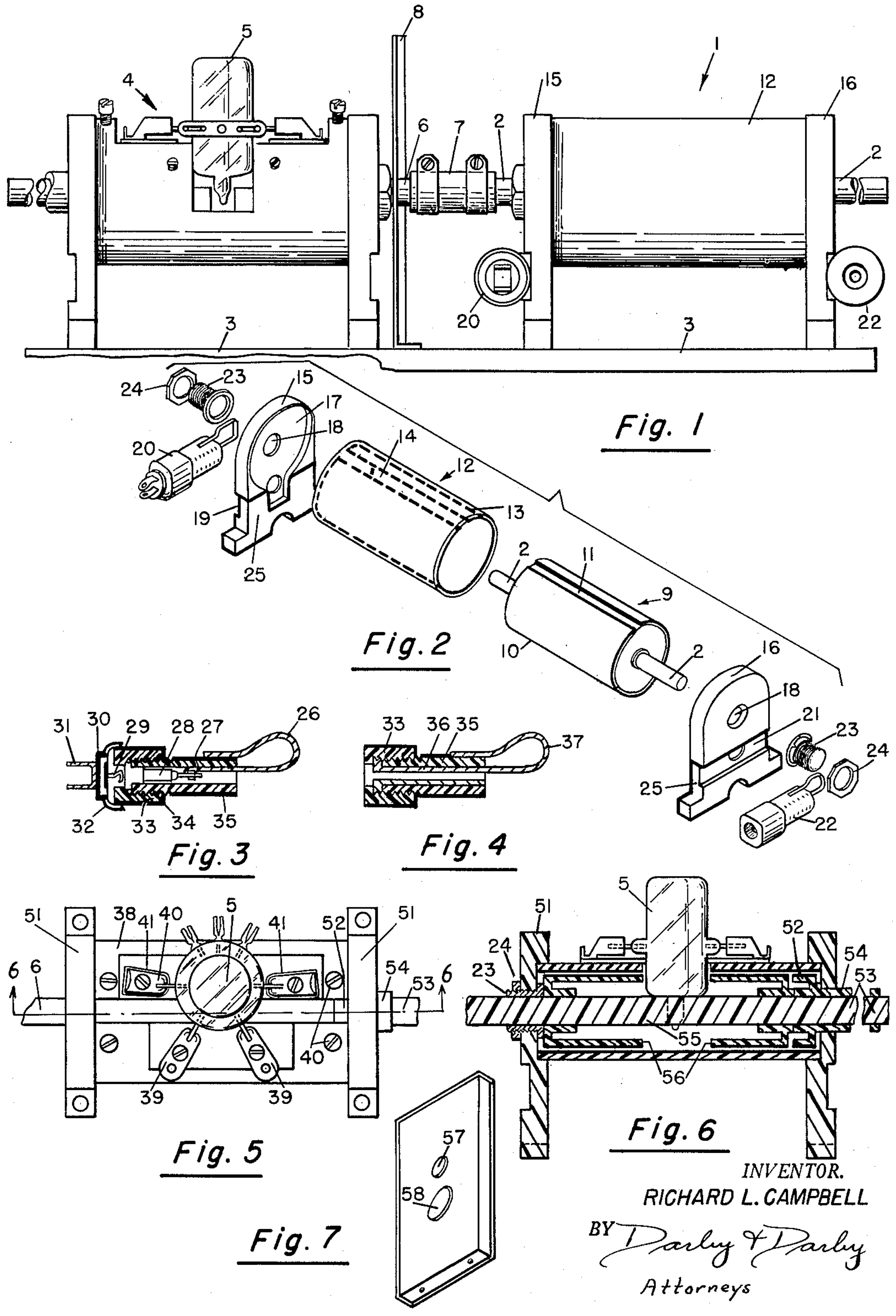
Figure 1 shows a side elevational view of a preferred ganged tuning assembly.
Figure 2 shows an exploded view of an antenna tuning unit.
Figure 3 shows a first detector coupling element assembly in cross-section.
Figure 4 shows an antenna coupling element assembly in cross-section.
Figure 5 shows a local oscillator unit assembly, in plan view.
Figure 6 is a sectional view through 6—6 of Figure 5.
Figure 7 shows a perspective view of a shield unit.

As may be seen by referring to Figure 1, a tuner assembly in accordance with this invention may comprise two units, one being an antenna unit and the other being an oscillator unit. The antenna tuning unit 1, having a rotor and a tuning shaft 2, may be mounted rigidly on a conducting base 3. The oscillator unit 4, having an oscillator tube 5 and a tuning shaft 6 is ganged firmly to the antenna unit by means of a shaft coupler 7. The oscillator unit is also mounted rigidly on the conducting base 3. A shield 8 is interposed between the antenna tuning and the oscillator units.

The antenna tuning unit 1, shown in exploded view in Figure 2, contains a cylindrical rotor member 9 formed of electrical conductive material, one form being a thin conductive plating on the cylindrical outer surface of an insulating base. Shaft ends 2 are rigidly affixed to the rotor. The cylindrical outer surface of the rotor 9 is coated with a thin layer 10 of conductive material. A strip 11 of insulating material extending longitudinally the length of the cylinder is left uncoated to form a slot. A tubular stator member 12 shown for clearness as if constructed of transparent plastic, has a conductive coating 13 on the inside surface thereof. The inner diameter of the tubular stator member 12 is slightly larger than the diameter of the cylindrical rotor member 9 so that the rotor rotates freely longitudinally with the stator. A longitudinal strip 14 running the length of the stator is left uncoated.

The ends of the stator unit 12 are affixed rigidly to the plate support members 15 and 16. These end supports 15 and 16 are preferably molded or machined from plastic or other insulating material. Each support contains a form-fitting cavity 17 for receiving the ends of the stator member 12 and an axial hole 18 through which the shaft 2 of the rotor member 9 passes when assembled. A transverse slot 19, located preferably near the base of the end support 15, receives a first detector coupling assembly 20. A similar slot 21 in the second end support 16 receives an antenna coupling assembly 22. Bearings 23 for the rotor shaft ends 2 fit into the axial holes 18 of the supports 15 and 16, and are retained in this position by means of threaded nuts 24. A coating 25 of conductive material on the lower portion of each of the supports 15 and 16 provides both a low inductance ground for the coupling assemblies 20 and 22 and a means for adding capacitance between the stator and ground as required.

The operation of the antenna tuning unit is as follows: when the rotor is rotatably in the position whereby its slot 11 is adjacent the slot 14 of tht stator, the electrical circuit comprises the inductance of the stator conductive coating 13 in parallel with the capacitance across the stator slot 14, the former being determined primarily by the dimensions of the stator, and the latter being determined primarily by the width of the slot. In this position the unit is tuned to its highest frequency. As the rotor is rotated, capacitance is effectively added in parallel with what was there before, so that the frequency of tuning is lowered. It has been found that a stator of 1 inch inside diameter, 2½ inch length, and having a slot ⅛ inch wide, tunes continuously from 350 to 1,050 megacycles per second.

The strips 11 and 14 may be formed in one of several ways. If the conductive coating is sprayed on the plastic, a masking strip may be attached prior to spraying and later removed. Alternatively, the entire cylindrical surfaces of rotor and stator may be coated, and later a slot may be ground, filed or cut away.

The preferred process for preparing the coating is to apply to the plastic form a suspension of finely divided metallic silver in acetate, evaporate the acetate, apply a solution of cyanide, copperplating, and finally silverplating.

In Figure 3 there is shown in cross section a detail of the first detector coupling assembly 20. A pickup loop 26 which by means of mutual inductance coupling receives energy both from the antenna tuning unit and the local oscillator, feeds the energy by way of a connector 27 to a crystal detector 28 mounted in the interior in a longitudinal bore therein. The other end of the crystal detector 28 is connected by means of a contact 29 to an ultra high frequency type radial by-pass condenser 30 mounted on the other end of the coupler assembly 20. A short coaxial electrical connector 31, attached to the condenser 30, provides a means for obtaining an intermediate frequency output signal from the crystal detector 28. The coaxial form prevents radiation from the connector. The tabs 32 of the condenser 30 are soldered to the outside of an outer housing 33 which has been plated on its periphery to form a conductive coating 34. The condenser and outside coating, in combination, form a low inductance by-pass for ultra high frequencies. The outer housing 33 is threaded on the inside to receive an inner housing 35 which is also of insulating material. The inner housing 35 is conductively plated on the outside surface, so that the loop 26 may be soldered to it. Contact between the outside plating of the inner and outer housings is made by extending the plating into the threaded portions. As an alternative method, the plated coatings may be soldered together after assembly.

The antenna coupling assembly 22 is shown in cross section in Figure 4. An outer housing unit 33 is threaded to an inner housing unit 35, both these parts preferably being identical to the housing units shown in Figure 3. An antenna insert 36 is formed into an antenna coupling loop 37 with the outer end soldered to the conductive plating on the outside of the inner housing 35. The antenna insert 36 is shaped to have a slight lateral curvature to make better contact with the inner conductor of a coaxial antenna line, connection to the outside conductor taking place through the conductive coating on the outside of the housing 33.

In Figure 5 is shown the plan view of the local oscillator section of the tuner. The oscillator tube 5, which is preferably a 6F4 type, is mounted on and connected to a stator 38. This stator 38 is similar to the stator 12 of the antenna unit already described but having portions cut away as shown in Figure 1 to accommodate and allow the insertion of the tube. Flat pin connectors 39, having upwardly curved edges slotted to engage the pin terminals of the oscillator tube 5, are attached providing parallel path connections between one side of the stator and the plate of the tube. The other side of the stator 38 is bypassed to the grid connectors 40 by means of capacitors formed by placing mica sheets 41 between the grid connectors 40 and the stator 38. The stator 38 is affixed rigidly to its end supports 42 which are similar to those 15 and 16 used in the antenna tuning unit. A trimmer 52 for tracking the oscillator and antenna tuning units is mounted between the shaft end 53 of the oscillator and the end support 51. The trimmer is used for oscillator alignment and may be rotated independently of the shaft 52 by means of the alignment handle 54.

The oscillator rotor construction may be best seen by referring to Figure 6 representing a sectional view through 6—6 of Figure 5. The tuning shaft 55 extends straight through the structure terminating in the shaft ends 6 and 53 already referred to. The rotor is now composed of two identical sections 56 of insulating material having axial symmetry and plated on the outside except for a thick unplated strip running parallel to the axis. The trimmer condenser 52 has axial symmetry and is plated around its periphery except for an axially extending slot. The trimmer control shaft 54 in addition to providing a means for adjusting the trimmer provides a bearing surface for the rotor shaft 55, the other bearing 23 of the type already described being inserted in the end support 51 and fastened therein by means of a nut 24. The operation of this type of trimmer is unusual in that it affects both the capacitance and the inductance of the tuning element.

The shield 8 shown in the assembly of Figure 1 is shown in more detail in Figure 7. An opening 57 in the shield allows passage for the oscillator tuning shaft 6. A second opening 58 below the other one is used to control the coupling between the oscillator stator 38 and the first detector coupling loop 26, so that an optimum oscillator voltage is provided to the detector. Alternately, a single opening of proper proportions might be used.

Figure 8:
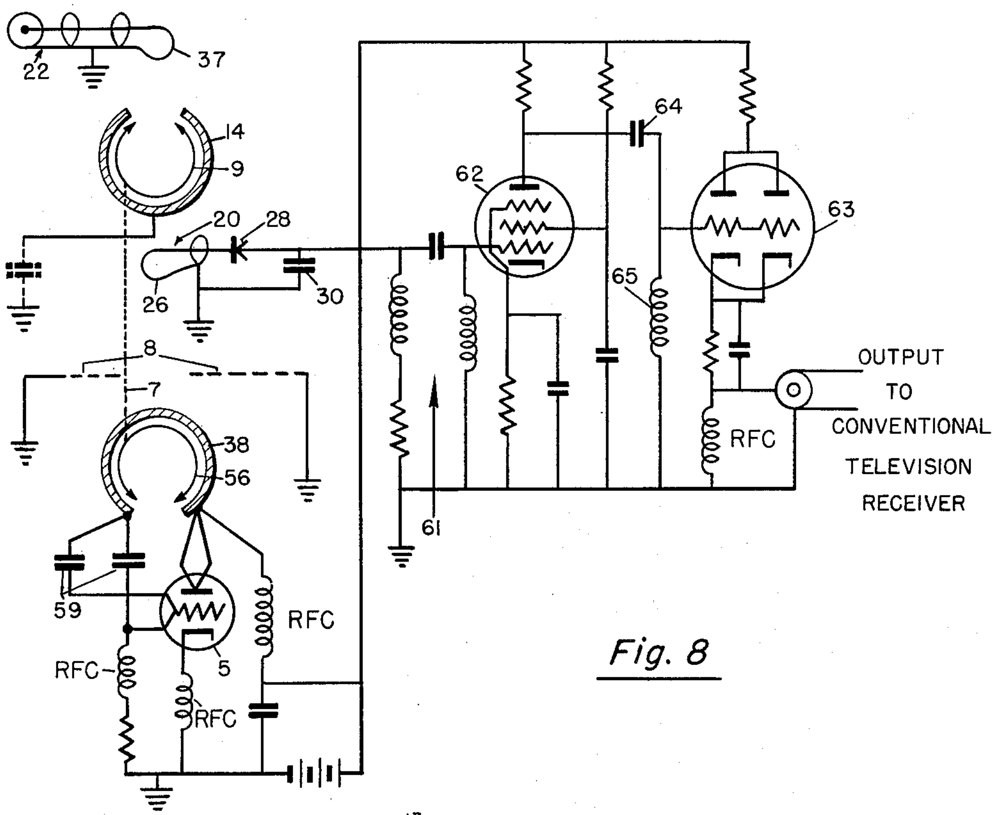
Figure 8 is a schematic diagram of part of a receiver utilizing a complete tuner.

Referring to the schematic diagram of Fig. 8, an antenna coupling loop 37 couples by means of mutual inductance into the antenna tank circuit comprising a stator 14 and a rotor 9 shown as part of the antenna tuning assembly of Figure 2. This tank circuit in turn is coupled to a first detector pickup loop 26. An oscillator tank circuit, comprising the stator 38 and the rotor 56, is connected to the plate of the oscillator tube 5. The other side of the oscillator tank circuit is coupled to the grid of the oscillator tube 5 by means of capacitors 59 of the type shown in Figure 5. The grid of the oscillator tube 5 is connected to ground through a radio frequency choke and a resistor. Plate voltage is supplied through a radio frequency choke. The cathode of the tube 5 and heater terminals (not shown) are connected to chassis ground and to a 6.3 volt supply respectively, through radio freqeuncy chokes. The oscillator voltage from the oscillator tank 38 is injected into the first detector pickup loop 26, the shield 8 providing a means for adjusting the voltage induced therein to the optimum value. Mechanical coupling between the two tank circuits is shown by the dotted line 7.

The voltages induced into the first detector pickup loop 26 are heterodyned in the crystal detector 28 to produce an intermediate frequency. The high frequency currents are bypassed to ground through the condenser 30 which is shown in detail in Figure 3.

The antenna tank circuit is coupled into the detector circuit, which at signal frequencies appears largely resistive, and hence, if the coupling is too tight, the Q of the tank circuit will be lowered unnecessarily. If, on the other hand, the coupling is too loose, signal will be lost, causing the converter to be unnecessarialy noisy. The degree of coupling can be controlled by the size and position of the coupling loop 26. The degree of coupling is not critical, but for best performance the extremes should be avoided.

Similarly, the degree of coupling to the antenna, controlled by the size and position of the coupling loop 37, in combination with the effective Q of the antenna, provides a resistive termination to the antenna lead-in cable, and this should be adjusted to optimum value if it is desired that this factor be controlled closely.

The rest of the circuit shown in Figure 8 will be described only briefly, since it is composed of elements well known to the art. A coupling network 61, tuned to intermediate frequency, injects the signal from the first detector into an intermediate frequency amplifier tube 62 of conventional type. The output of the amplifier tube 62 is coupled into a cathode follower 63 by means of a blocking capacitor 64, an inductance 65 being resonant at the desired intermediate frequency with tube capacitances.

Figure 9:
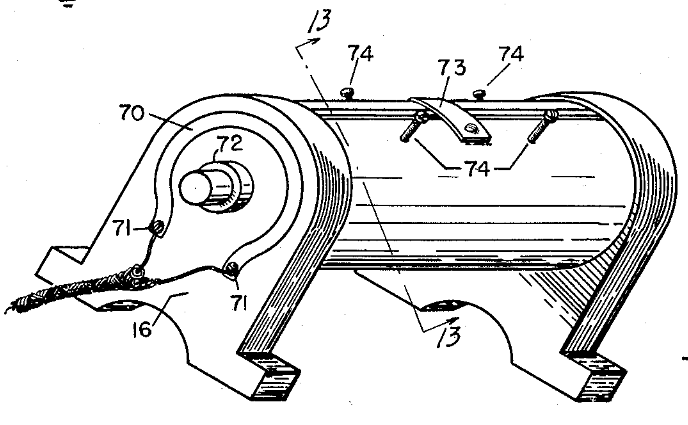
Figure 9 shows a perspective view of an alternative form of antenna tuning unit.

In Figure 9 is shown, in perspective and at an angle so the top of the structure can be readily seen, an alternate form of an antenna unit. The unit is constructed of non-conducting moldable material, and has a conductive member inserted within it. On the end bell 16 of insulating material, a circular loop 70 of conductive material is coated, to form an alternate form of coupling loop for the antenna, the terminals of the lead-in cable being affixed to the loop by means of the two screws 71. Mounted in the same end bell 16 is an adjustable tracking adjustment of the type already described and shown in Figure 5, having an adjusting end 72. A second tracking adjustment is provided by the compression-type adjustable trimmer capacitor 73, this being similar to the compression type trimmer capacitors well known to the art, and providing capacitance across the slot. A third form of tracking adjustment is provided by the adjusting screws 74, these extending through the plastic outer structure to engage the metallic insert, and by means of pressure exerted thereon to change the spacing between the metallic insert and the rotor. The action of the three adjustments 72, 73, and 74 is exceptionally useful in that the adjustment 73 has most effect at the high frequency end, and the adjustment 74 has the most effect at the low frequency end, while the adjustment 72 effects tuning at both ends. By means of the three adjustments the antenna tuning unit can be made to track exactly with the oscillator at three points in the band of receivable signals.

Figure 10:
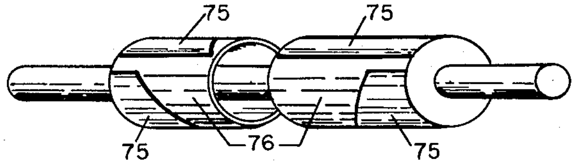
Figure 10 shows in perspective view an alternative form of rotor.

In Figure 10 is shown a variation in the construction of a rotor in which the conductive coating material 75 is applied to the insulating supports 76 in unsymmetrical manner, preferably wedge-shaped or tapering as shown for the purpose of obtaining a more constant relation between tuned frequency and degrees of rotation of the shaft. It will be evident that many variations of applied pattern may be useful for various applications, such as linear wavelength scales or bandspread of certain spectral regions. For similar applications the conductive coating may be applied in a tapering pattern alternatively to the stator.

Figure 11:
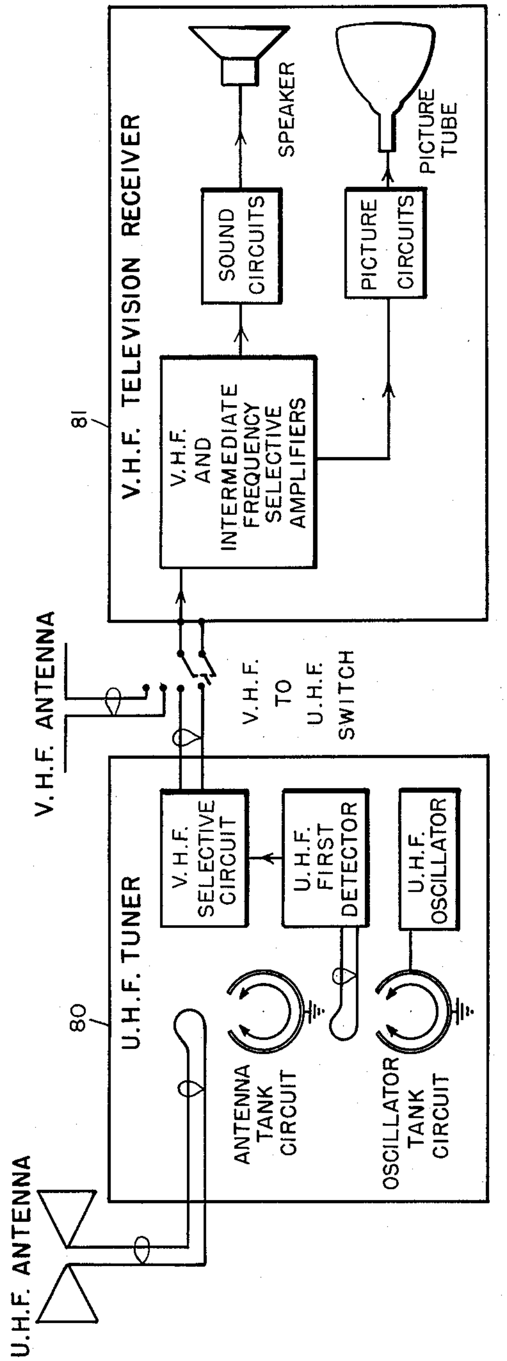
Figures 11 and 12 show in block diagram two ways in which the tuner described can be used to receive television signals at ultra high frequency.
Figure 12:
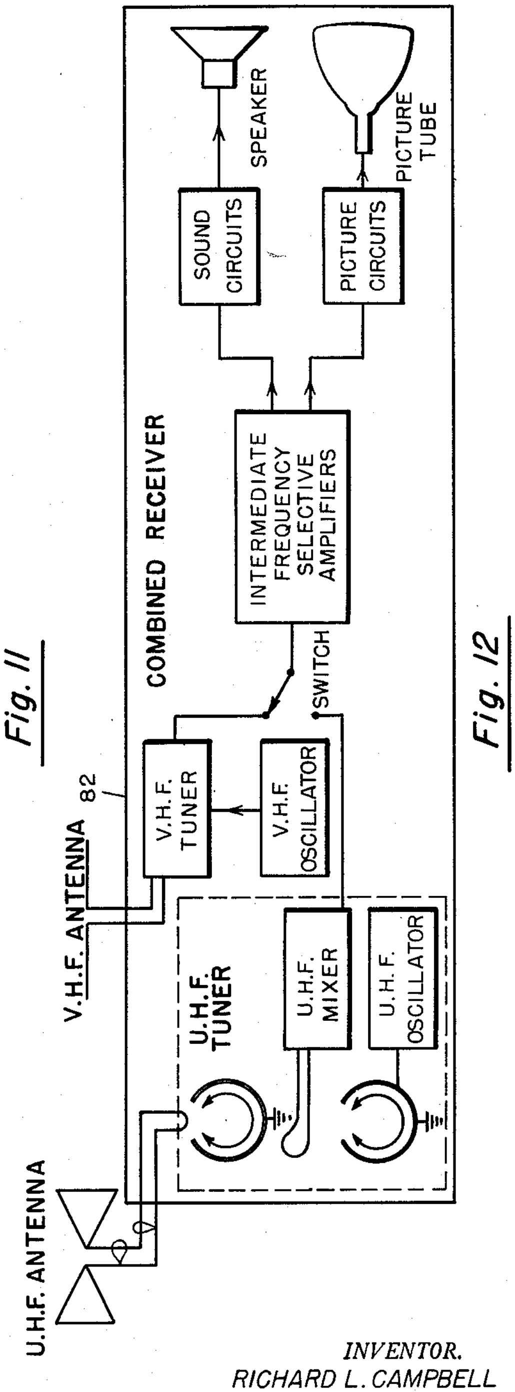
Figure 13:
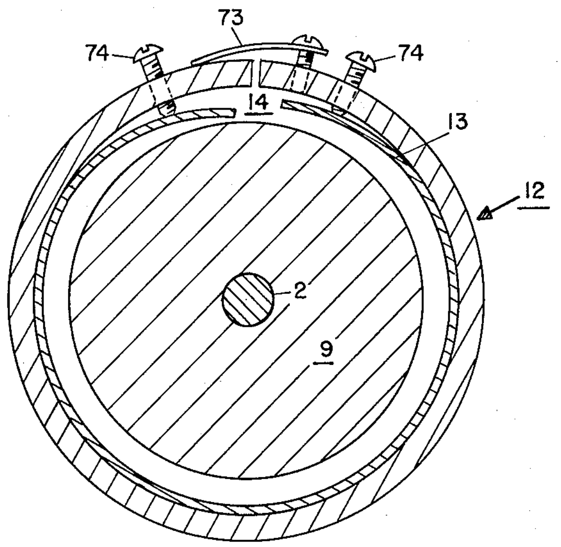
Figure 13 is a cross-sectional view taken on the line 13—13 of Fig. 9.

Figures 11 and 12 show diagrammatically two methods in which the described tuner may be used. In Figure 11 the tuner 80 is used as a supplement to a conventional television receiver 81. In this case the oscillator tank circuit is preferably tuned below the frequency of the antenna tank circuit by an amount equal to the center frequency of one of the channels receivable in the conventional receiver. Tuning of ultra high frequency is then accomplished by means of the tuner, the tuning of the conventional receiver being left as set.

In Figure 12 there is shown one way in which the ultra high frequency tuner 80 can be incorporated into a combined receiver. The ultra high frequency tuner provides a television signal at intermediate frequency, which is delivered into a switch. Into the same switch is also introduced a second signal at intermediate frequency from a conventional television input assembly consisting of a very high frequency selective circuit, a local oscillator and mixer as shown, said last named assembly receiving radiant energy from a conventional very high frequency television antenna 82. It should be understood that switching can be accomplished in other ways, such as in the "B" supply of the local oscillator, these ways being well known to the art.

Although a preferred embodiment of my invention has been described in detail other embodiments of my invention will be apparent to those skilled in the art. Other such embodiments would be the apparatus shown without the antenna coil. This embodiment would result in a saving of cost but would result in the reception of undesired signals at image and intermediate frequency.

Although for the purpose of low expense in large quantities, the tank circuits in a preferred form have been described as being molded plastic coated with a thin conductive coating, metal inserts or solid metal parts alternatively can be used without departing from the scope of my invention. Also paper or laminated tubing could be used as an insulated structure to be coated with metal.

In one embodiment of my invention the rotor of the oscillator is made of a mica-filled plastic material having a low coefficient of thermal expansion while the stator is made of aluminum. This combination provides thermal stability of the oscillator.

In another embodiment of my invention the outside of the rotor is sprayed with a thin layer of dielectric material. This prevents the peeling of the conductive coating, insures against short circuits and raises the capacitance between the rotor and the stator, thereby increasing the frequency range.

Although certain embodiments and features have been shown and described, the exact scope of my invention can best be understood from the following claims.

What is claimed is:

1. In a tuning element coprising an elongated C-shaped conductive member, an insulating structure affixed to an end thereof, and a conductive loop coated upon said insulating structure and providing electrical coupling to said tuning element.

2. In a tuning element comprising an elongated C-shaped conductive member, an insulating member attached to an end thereof, and a coupling member attached to said insulating member, said coupling member comprising a conductive loop and a conductive connector therefor, a crystal diode positioned within said connector and electrically insulated therefrom, the ends of said conductive loop being connected respectively to said connector and to said crystal diode.

3. A tuning element for high frequency electrical waves comprising a first cylindrical member having a conductive surface, said surface having a longitudinal slot therein, a second cylindrical member having a conductive surface, said second member being supported within said first member and rotatable about the longitudinal axis thereof, said conductive surface of said second member having a longitudinal slot therein, and a third cylindrical member having a conductive surface, said third member being supported within said first member and rotatable about said axis independently of said second member, the conductive surface of said third member being electrically coupled to the conductive surface of said first member.

4. A tuning element for high frequency waves comprising an elongated stator member having an electrically conductive surface with a longitudinal slot therein, a first elongated cylindrical rotatable member having an electrically conductive surface with a longitudinal slot therein and supported to be rotatable about the longitudinal axis of said stator member, and a second rotatable member supported axially adjacent said first rotatable member, said second member having an electrically conductive cylindrical surface with a longitudinal slot therein, said conductive surface of each said rotatable member being adjacent said conductive surface of said stator member within the electrostatic field thereof.

5. A tuner comprising an elongated fixed cylindrical conductive member having a longitudinal slot therein, a first conductive rotatable rotor member supported axially within said fixed cylindrical member, a first adjustable tracking member comprising a variable capacitance connected to said fixed conductive member to bridge across said slot, and a second adjustable tracking member comprising a second conductive rotatable member positioned axially adjacent said first rotor member within the confines of said fixed cylindrical member and rotatable independently of said rotor member.

6. A tuner comprising a body support member having an opening therein, an elongated C-shaped conductive stator member supported within said opening, a rotatable tuning member positioned within said C-shaped stator member, an adjustable tracking means comprising a tracking screw threaded in said body member with the end thereof abutting the surface of said C-shaped stator member, and a vernier tuning adjustment member comprising a conductive C-shaped rotatable member supported within the confines of said stator member and rotatable independently of said tuning member.

7. A tuner comprising a body support member having an opening therein, an elongated C-shaped conductive stator member supported within said opening, a rotatable tuning member supported within said C-shaped member, a first adjustable tracking member comprising a tracking screw threaded in said body member abutting the surface of said C-shaped stator member, a vernier tuning adjustment member comprising a conductive C-shaped rotatable member supported within the confines of said stator member and rotatable independently of said rotatable tuning member, and a second tracking adjustment means comprising a variable capacitance member connected to said conductive stator member across said slot.

8. A tuner comprising a conductive cylindrical tuning member having a longitudinal slot along the length thereof, and a variable capacitance tuning element comprising a conductive strap attached to said member near one edge of said slot and extending across said slot and overlapping without contact a portion of said member near the remaining edge of said slot, and means for adjusting the spacing between the overlapping portion of said strap and said portion of said member.

References Cited in the file of this patent

UNITED STATES PATENTS

| | | |
|---|---|---|
| 1,335,846 | Merritt | Apr. 6, 1920 |
| 2,044,413 | Weyrich | June 16, 1936 |
| 2,141,756 | Linsell | Dec. 27, 1938 |
| 2,142,159 | Southworth et al. | Jan. 3, 1939 |
| 2,206,683 | Wolff | July 2, 1940 |
| 2,216,011 | Hollman | Sept. 24, 1940 |
| 2,227,487 | Chaffee | Jan. 7, 1941 |
| 2,246,928 | Schick | June 24, 1941 |
| 2,251,631 | Mayer | Aug. 5, 1941 |
| 2,383,322 | Koch | Aug. 21, 1945 |
| 2,390,009 | Stott | Nov. 27, 1945 |
| 2,412,314 | Boerner et al. | Dec. 10, 1946 |
| 2,436,830 | Sharpless | Mar. 2, 1948 |
| 2,448,554 | Simopoulos | Nov. 7, 1948 |
| 2,465,639 | Edson | Mar. 8, 1949 |
| 2,474,988 | Sargrove | July 5, 1949 |
| 2,482,393 | Wilburn | Sept. 20, 1949 |
| 2,483,893 | Everett | Oct. 4, 1949 |
| 2,490,968 | Keizer | Dec. 13, 1949 |
| 2,496,772 | Bradley | Feb. 7, 1950 |
| 2,507,995 | Reid | May 16, 1950 |
| 2,516,889 | Libby | Aug. 1, 1950 |
| 2,542,841 | Roberds | Feb. 20, 1951 |
| 2,543,891 | Carlson et al. | Mar. 6, 1951 |
| 2,578,429 | Karplus | Dec. 11, 1951 |
| 2,590,864 | Johnson | Apr. 1, 1952 |
| 2,596,117 | Bell et al. | May 13, 1952 |
| 2,598,857 | Sziklai | June 3, 1952 |
| 2,638,544 | Schreiner | May 12, 1953 |

OTHER REFERENCES

"Metallizing Non-Conductors" by Samuel Weing, Metal Industry Pub. Co.